(12) United States Patent
Lee et al.

(10) Patent No.: US 8,189,307 B2
(45) Date of Patent: May 29, 2012

(54) COMPOSITE TYPE ELECTRIC CIRCUIT BREAKER AND METHOD THEREOF

(75) Inventors: Jun Bae Lee, Seoul (KR); Shin Yon Jo, Incheon (KR); Seung Gil Lee, Anyang-si (KR); Ki Heung Chang, Seoul (KR)

(73) Assignee: HETKO, Inc., Seoul (KR)

( * ) Notice: Subject to any disclaimer, the term of this patent is extended or adjusted under 35 U.S.C. 154(b) by 213 days.

(21) Appl. No.: 12/732,375

(22) Filed: Mar. 26, 2010

(65) Prior Publication Data

US 2010/0324747 A1 Dec. 23, 2010

(30) Foreign Application Priority Data

Jun. 19, 2009 (KR) .................. 10-2009-0054812

(51) Int. Cl.
*H02H 3/16* (2006.01)
(52) U.S. Cl. .......................................... 361/42; 361/44
(58) Field of Classification Search ............. 361/42–50
See application file for complete search history.

(56) References Cited

U.S. PATENT DOCUMENTS

2005/0225909 A1* 10/2005 Yoshizaki et al. .............. 361/42
2006/0020406 A1* 1/2006 Takakamo et al. .............. 702/64

\* cited by examiner

*Primary Examiner* — Danny Nguyen
(74) *Attorney, Agent, or Firm* — Berenato & White, LLC

(57) ABSTRACT

A composite electric circuit breaker, and method thereof, is configured to detect signals regarding arc faults, overcurrent, and earth leakage. Arcs and electric currents are detected by a current transformer and earth leakage is detected by a zero phase current transformer. A variation of electric current, the number of arcs which are generated per a unit time, a present electric current value, and electric current earth leakage are combined to judge whether arc faults occur to then interrupt an electric power supply. Temperature is measured on a printed circuit board, and if temperature rise occurs, the electric power supply is interrupted, and an interruption cause is displayed. Electric accidents and occurrence of fires are prevented simultaneously and more accurately. The interruption causes can be confirmed, analyzed and externally monitored through a network, to thus maximize efficiency of electric management.

15 Claims, 16 Drawing Sheets

(A)

(B)

COMPOSITE TYPE ELECTRIC CIRCUIT BREAKER AND METHOD THEREOF

CROSS-REFERENCE TO RELATED APPLICATIONS AND CLAIM TO PRIORITY

This application is related to application number 10-2009-0054812, filed Jun. 19, 2009, in the Republic of Korea, the disclosure of which is incorporated by reference and to which priority is claimed.

FIELD OF THE INVENTION

The present invention relates to a composite type electric circuit breaker and a method thereof, and more particularly, to a composite type electric circuit breaker and a method thereof, which detects signals regarding arc faults, overcurrent, and earth leakage which are electric danger factors, compositely grasps association of the respective detection signals, and interrupts electricity, to thereby interrupt and manage an electric risk situation more accurately.

BACKGROUND OF THE INVENTION

Generally, earth leakage circuit breakers (ELBs) are used to prevent an electric shock of a human body and a fire by earth leakage, or molded case circuit breakers (MCCBs) are used to prevent overcurrent by short circuits and to protect load terminals, in houses, buildings, etc.

The molded case circuit breakers (MCCBs) are used for the purpose of protecting electric wires, and the earth leakage circuit breakers (ELBs) are used for the purpose of protecting a user by detecting whether or not he or she is electrically shocked through an electric circuit when he or she is using an electric device and interrupting an electric power supply.

As described above, although the earth leakage circuit breakers (ELBs) may prevent electric shocks due to earth leakage, and the molded case circuit breakers (MCCBs) may prevent a fire or damage of loads due to overcurrent, there are a variety of electric defects which may not be prevented by the earth leakage circuit breakers (ELBs) and the molded case circuit breakers (MCCBs). Arc faults occupy the largest frequency among the various electric defects.

Arc faults occur at all areas from electric power distribution systems to indoor electric wires, electric power cords, loads (electric or electronic devices). Occurrence of most arc faults is caused by external exposure of coated electric wires due to aging and damage of insulation and coating in electric cables, mechanical and electrical stress resulting from overcurrent, defective connection, excessive damage of insulation and wires, etc. In this case, electric current flows through metallic outer surfaces of electric or electronic devices. Most of the arc faults are not protected by overcurrent circuit breakers or earth leakage circuit breakers which are circuit breakers for wiring.

The reason is because arc faults induce overcurrent quickly, electric or electronic devices are not directly grounded in most cases, or arc faults occur even at a low electric current and high impedance mode.

In addition, arc faults occur to thus cause a high temperature fashion. As a result, the arc faults may be detected and interrupted by ground fault circuit interrupters (GFCIs) only when sufficient leakage current flows through the ground. Further, such interrupters operate only when electric current due to arc faults exceeds parameters of thermal/magnetic structures. As a result, Arc Fault Circuit Interrupters (AFCIs) which can interrupt arc faults are essentially required.

However, since existing general circuit breakers can detect only one electric danger factor, respectively, the respective circuit breakers should be installed in order to detect electric danger factors such as arc faults, overload or overcurrent, and ground faults, to accordingly cause to be troublesome as well as to be economically burdensome. Moreover, the existing circuit breakers do not have any association of the respective danger signals but operate individually. As a result, the existing circuit breakers do not detect risky situations timely and accurately, or misperceive a normal situation as a dangerous situation, to thus frequently malfunction.

SUMMARY OF THE INVENTION

To overcome inconveniences of the conventional art, it is an object of the present invention to provide a composite type electric circuit breaker and a method thereof, which monitors risk signals such as arc faults, overcurrents, and earth leakage in real-time, using an embedded controller, to thereby detect various danger factors more actively and simultaneously.

It is another object of the present invention to provide a composite type electric circuit breaker and a method thereof, which compositely reinterprets respective detected risk signals, and grasps association of the respective risk signals, to thus detect and interrupt the respective risk signals and to thereby interrupt situations at which existing general circuit breakers cannot detect risk signals.

It is still another object of the present invention to provide a composite type electric circuit breaker and a method thereof, which simultaneously prevents electric accidents and occurrence of fire more accurately, and supports functions of communications for network, to thereby identify and analyze interrupted reasons through an external monitoring system and maximize an efficiency of electricity management.

To accomplish the above object of the present invention, according to an aspect of the present invention, there is provided a composite type electric circuit breaker comprising:

a current transformer (CT) and a zero phase current transformer (ZCT) which are installed between an external voltage input line and a load end;

an arc detector which detects electric current due to arc faults from the current transformer (CT);

a plurality of overcurrent detectors whose response speeds are respectively differently designed and which perceives change of electric current and a present current value from the current transformer (CT), respectively, to thereby detect overcurrent;

an earth leakage detector which detects an amount of earth leakage due to earth leakage from the zero phase current transformer (ZCT);

a microprocessor which generates a trip signal to interrupt an electric power supply at the time of detecting overcurrent and earth leakage from the overcurrent detectors and the earth leakage detector, and combines the number of arc signals, a present current value, change of electric current and an amount of earth leakage which are detected from the arc detector, the overcurrent detectors and the earth leakage detector, respectively, to thereby judge whether or not arc faults are generated, and to thus generate the trip signal which interrupts the electric power supply when the arc faults are generated; and an interrupter which interrupts a supply of external voltage between the external voltage input line and the load end according to the trip signal applied from the microprocessor.

According to another aspect of the present invention, there is provided a composite type electric circuit breaking method comprising the steps of:

(a) detecting an arc signal, an overcurrent signal, and an earth leakage signal, respectively; and (b) counting the number of detected arc signals, and compositely interpreting the respective arc, overcurrent, and earth leakage signals detected at each point in time of a number of decision points in time, according to a predetermined interruption condition, to thereby grasp association of the respectively detected arc, overcurrent, and earth leakage signals, and to thus interrupt an electric power supply, wherein the electric power supply interruption step (b) comprises the sub-steps of:

(b1) if a present point in time is a first decision point in time at which predetermined time has passed from an arc generated point in time, judging whether or not an arc signal is generated according to whether or not a present electric current value is at an overcurrent mode, when the number of counted arc signals is not less than a predetermined number of times and electric current is changed;

(b2) if it is judged that no arc signals have been generated at the first decision point in time, cumulatively counting the number of arc signals generated from the first decision point in time to a second decision point in time at which predetermined time has passed from the first decision point in time, and judging whether or not the generated arc signals are considered as arc signals according to whether or not the present electric current value is not less than a rating electric current value, when the number of the cumulatively counted arc signals is not less than a predetermined number of times and electric current is changed;

(b3) if it is judged that no arc signals have been generated at the second decision point in time, cumulatively counting the number of arc signals generated from the second decision point in time to a third decision point in time at which predetermined time has passed from the second decision point in time, and judging whether or not the generated arc signals are considered as arc signals according to whether or not the present electric current value is not less than a predetermined value, when the number of the cumulatively counted arc signals is not less than a predetermined number of times and electric current is changed; and (b4) if it is judged that no arc signals have been generated at the third decision point in time, cumulatively counting the number of arc signals generated from the third decision point in time to a fourth decision point in time at which predetermined time has passed from the third decision point in time, and judging whether or not the generated arc signals are considered as arc signals according to whether or not the present electric current value is not less than a predetermined value, when the number of the cumulatively counted arc signals is not less than a predetermined number of times and electric current is changed.

BRIEF DESCRIPTION OF THE DRAWINGS

The above and/or other aspects of the present invention will become apparent and more readily appreciated from the following description of the exemplary embodiments, taken in conjunction with the accompanying drawings in which.

DETAILED DESCRIPTION OF THE PREFERRED EMBODIMENT(S)

Figure 1:
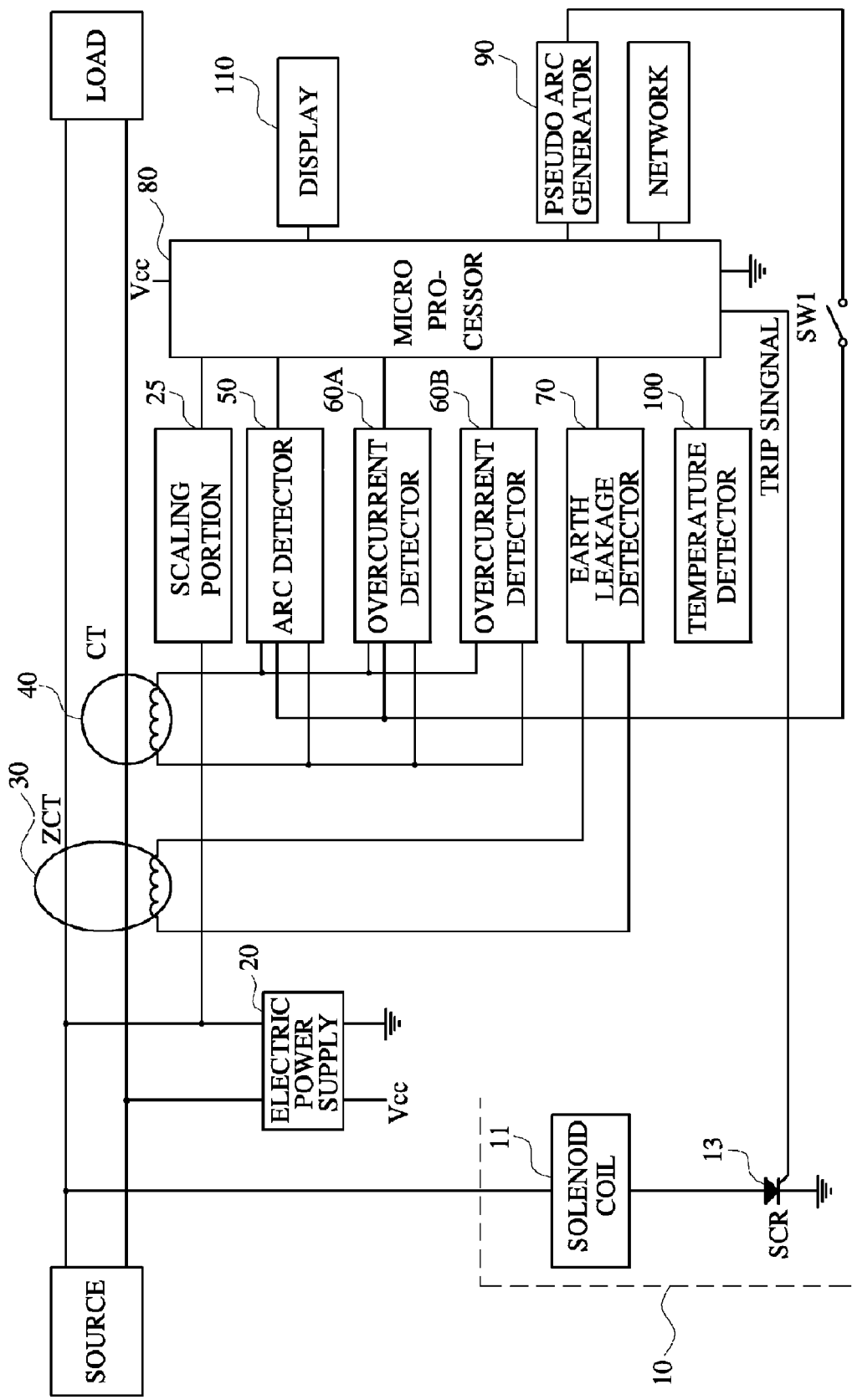
FIG. 1 is a block diagram entirely showing a composite type electric circuit breaker according to an embodiment of the present invention.

Hereinbelow, a composite type electric circuit breaker and a method thereof according to an embodiment of the present invention will be described with reference to the accompanying drawings. Like reference numerals are assigned for like elements in the drawings.

FIG. 1 is a block diagram entirely showing a composite type electric circuit breaker according to an embodiment of the present invention.

In the case of the composite type electric circuit breaker shown in FIG. 1, an interrupter 10, an electric power supply 20, a zero phase current transformer (ZCT) 30, and a current transformer (CT) 40 are respectively connected to an electric power supply line which connects a source and a load. Here, the interrupter 10 includes a solenoid coil 11 and a silicon controlled rectifier (SCR) 13. The electric power supply 20 receives an alternating-current (AC) electric power supply voltage, and supplies a circuit driving voltage (Vcc) necessary for driving components of the composite type electric circuit breaker. A scaling portion 25 is connected to the electric power supply 20, in order to monitor a currently input voltage. The zero phase current transformer (ZCT) 30 is a sensor which can detect earth leakage, and the current transformer (CT) 40 is a sensor which can detect arc and electric current. An additional current transformer (CT) may be installed in order to detect high electric current. An arc detector 50 and a plurality of overcurrent detectors 60A and 60B are connected to the current transformer (CT) 40, respectively. An earth leakage detector 70 is connected to the zero phase current transformer (ZCT) 30. The composite type electric circuit breaker of FIG. 1 also includes: a microprocessor which receives risk signals such as the respectively detected arc signals, overcurrent signals, and earth leakage signals, monitors a present electric power supply state based on the received risk signals, and generates a trip signal which enables the interrupter 10 to operate when the present electric power supply state is judged as occurrence of a dangerous situation; a pseudo arc generator 90 which generates a pseudo arc signal to thus test whether or not the composite type electric circuit breaker operates normally; a temperature detector 100 which detects present temperature on a printed circuit board (PCB); and a display 110 which displays a cause of interrupting the electric power supply or indicates whether or not the composite type electric circuit breaker operates normally. Here, the pseudo arc generator 90 is connected to the arc detector 50 through a switch (SW1). Accordingly, when the switch (SW1) is turned on, a pseudo arc signal generated from the pseudo arc generator 90 is detected by the arc detector 50. In addition, a network is connected to the microprocessor 80. As a result, the microprocessor 80 may send an operational result of the composite type electric circuit breaker via the network.

Detailed operations of the composite type electric circuit breaker of FIG. 1 having the above-described configuration will be described below with reference to FIGS. 2 through 14.

The electric power supply 20 supplies a driving voltage (Vcc) necessary for respective circuits in the composite type electric circuit breaker. Here, the scaling portion 25 which is connected between the electric power supply 20 and the microprocessor 80 scales phase, that is, a voltage cycle of present input voltage which is input through alternating-current (AC) lines, so as to be measured by the microprocessor 80.

Figure 2:
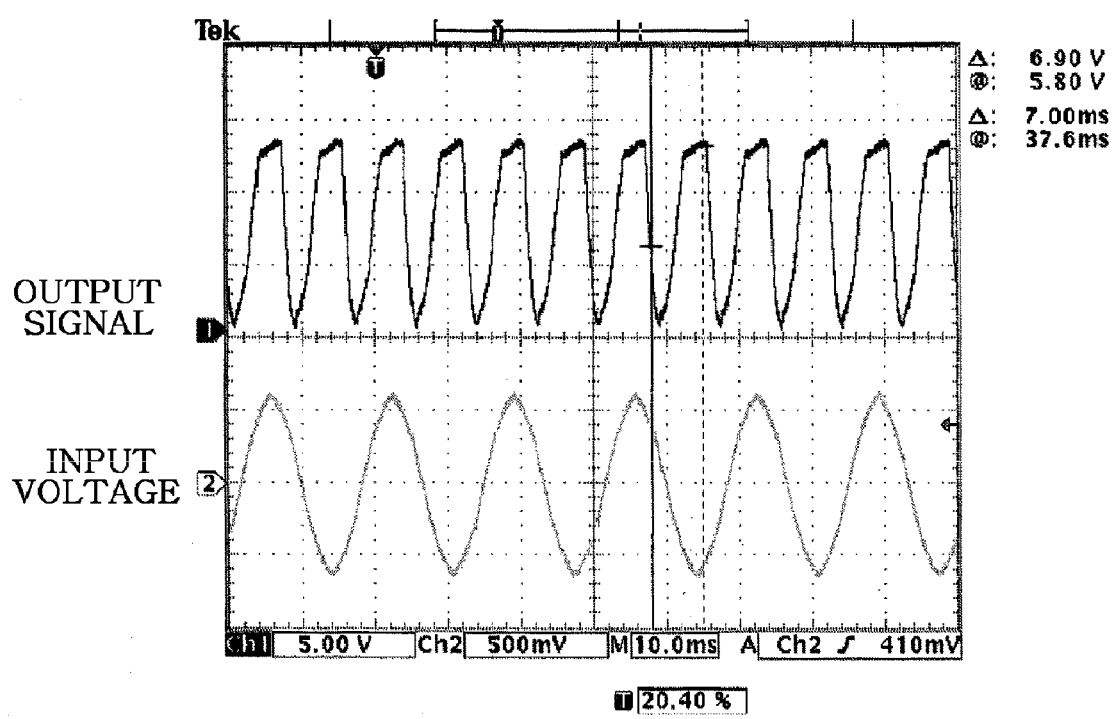
FIG. 2 is a signal waveform diagram showing an input voltage and an output signal.

FIG. 2 shows an input voltage and an output signal of the scaling portion 25.

In the case that a present input voltage of 120V having the frequency of 60 Hz, the scaling portion 25 scales the input voltage of the lower waveform of FIG. 2 and changes the input voltage of 120V having the frequency of 60 Hz into voltage of 5V having the frequency of 120 Hz to thus output an output signal of the upper waveform of FIG. 2, with a result that the microprocessor 80 can monitor operation of the composite type electric circuit breaker. The microprocessor 80 measures a cycle of alternating-current (AC) voltage from signal waveform of the input voltage scaled through the scaling portion 25, and confirms whether or not the interrupter 10 interrupts the electric power supply, to thereby set up an interruption time base on the input signals. Also, the microprocessor 80 can confirm monitoring of electric current and judgment of arc signals based on the input signals.

If the electric power supply is applied to the current transformer (CT) 40 through the alternating-current (AC) lines, the current transformer (CT) 40 converts a difference between electric current values through the alternating-current (AC) lines into a voltage value, and outputs the converted result, that is, the voltage value to the arc detector 50. The arc detector 50 receives the voltage signal of the voltage value according to an electric current change rate of the current transformer (CT) 40, and judges whether or not arc faults occur. Here, as shown in FIG. 3, the arc detector 50 includes a band pass filter 51 and a single pulse generator 53 in order to pass only high frequency characteristics which appear in case of occurrence of arcs.

Figure 3:
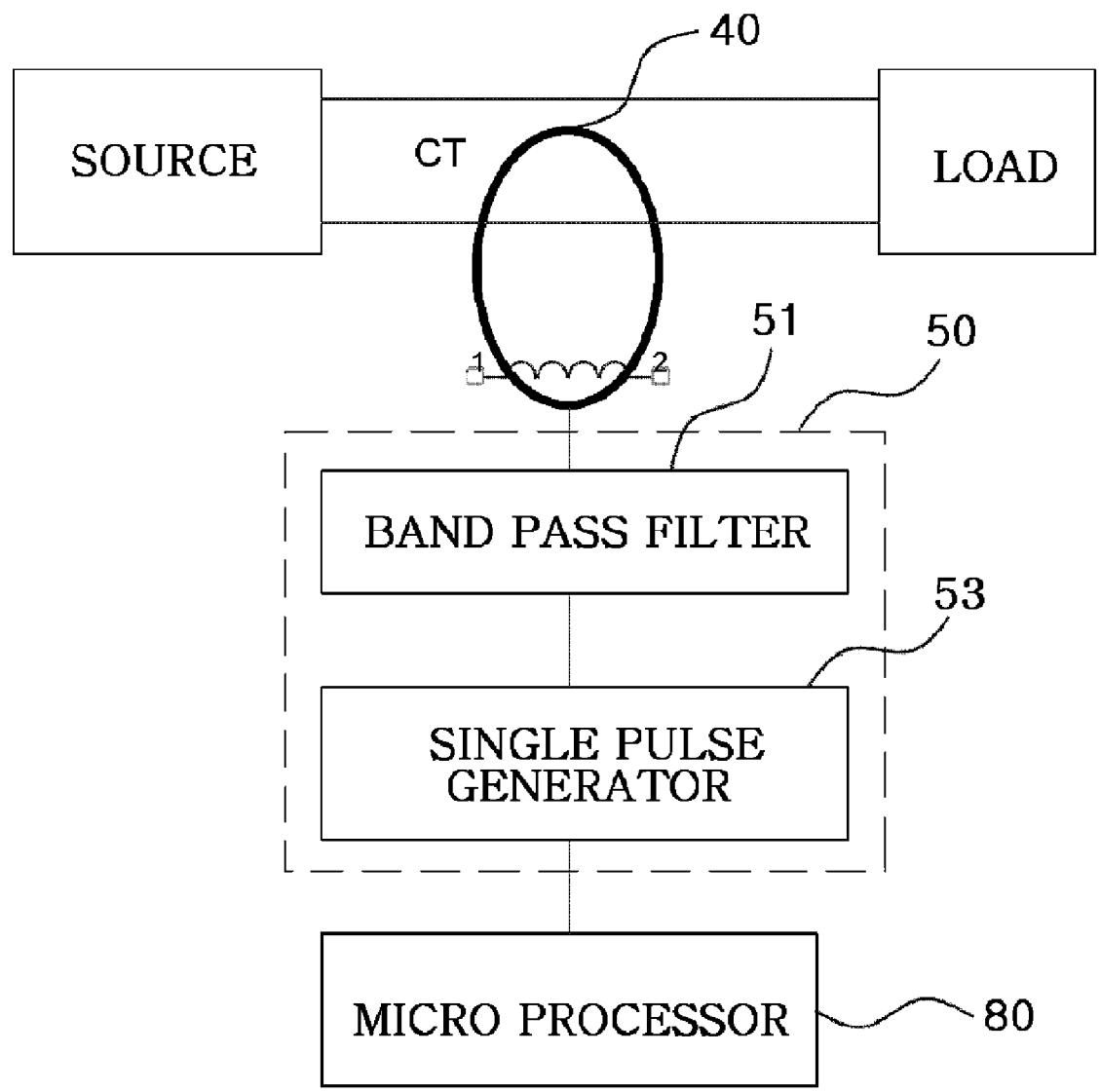
FIG. 3 is a block diagram showing an arc detector of FIG. 1.

As shown in FIG. 3, the band pass filter 51 in the arc detector 50 receives a voltage difference which occurs by defect of the wires wired along the alternating-current (AC) lines from the current transformer (CT) 40, and performs band pass filtering of the received voltage difference, to thereby exclude a signal with respect to a load and pass only high frequency characteristics which appear in case of occurrence of arcs. Generally, an arc signal is a high frequency signal. Thus, if such an arc signal of a high frequency characteristic is directly input to the microprocessor 80, the microprocessor 80 may not exactly distinguish the arc signal. Therefore, the single pulse generator 53 is used to generate a single pulse of a predetermined level only when the signal of the high frequency characteristic which has passed through the band pass filter 51 has become not less than a predetermined level, to thereby make the microprocessor 80 exactly distinguish the arc signal.

Figure 4:
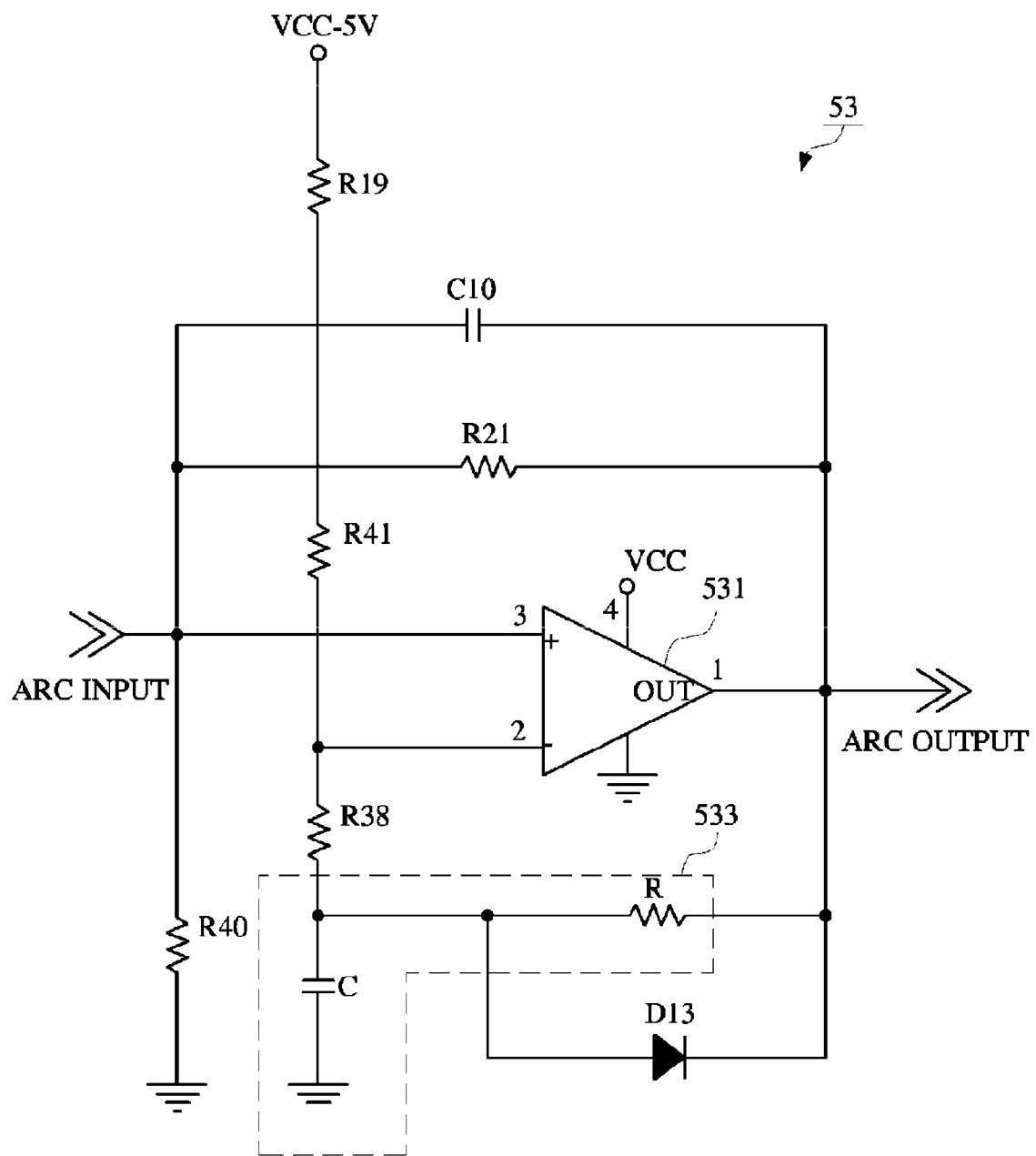
FIG. 4 is a schematic circuit diagram showing a single pulse generator of FIG. 3.
Figure 5:
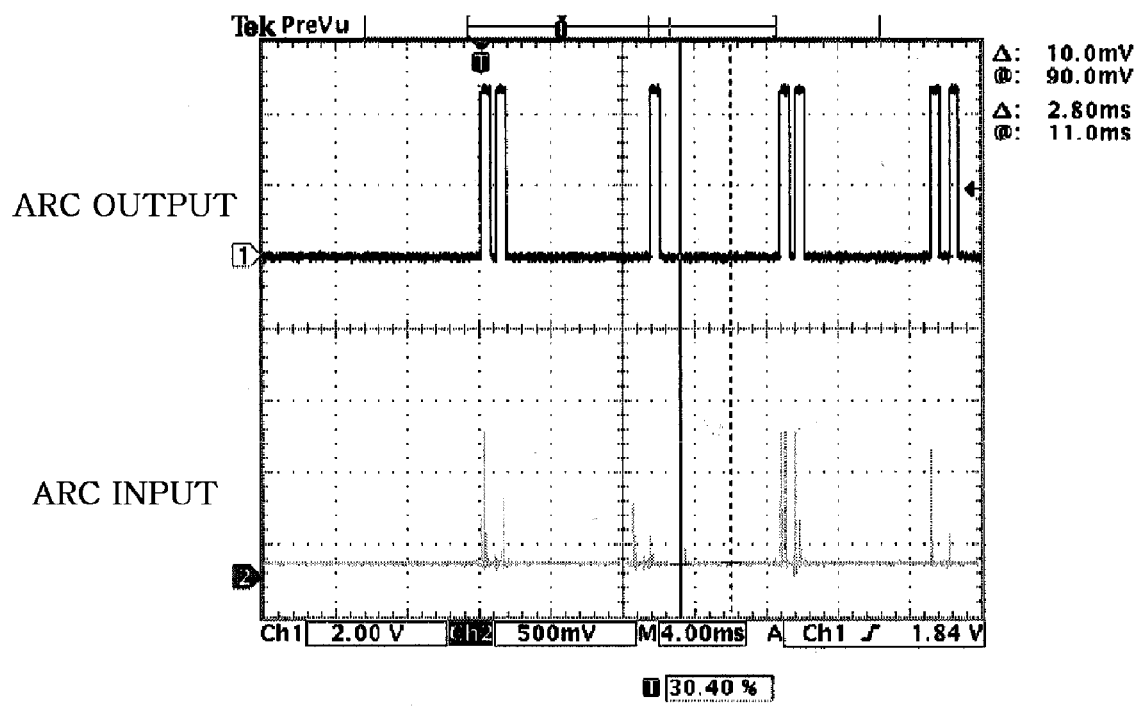
FIG. 5 is an arc signal waveform diagram showing an arc input and an arc output of the single pulse generator of FIG. 3.
Figure 6A:
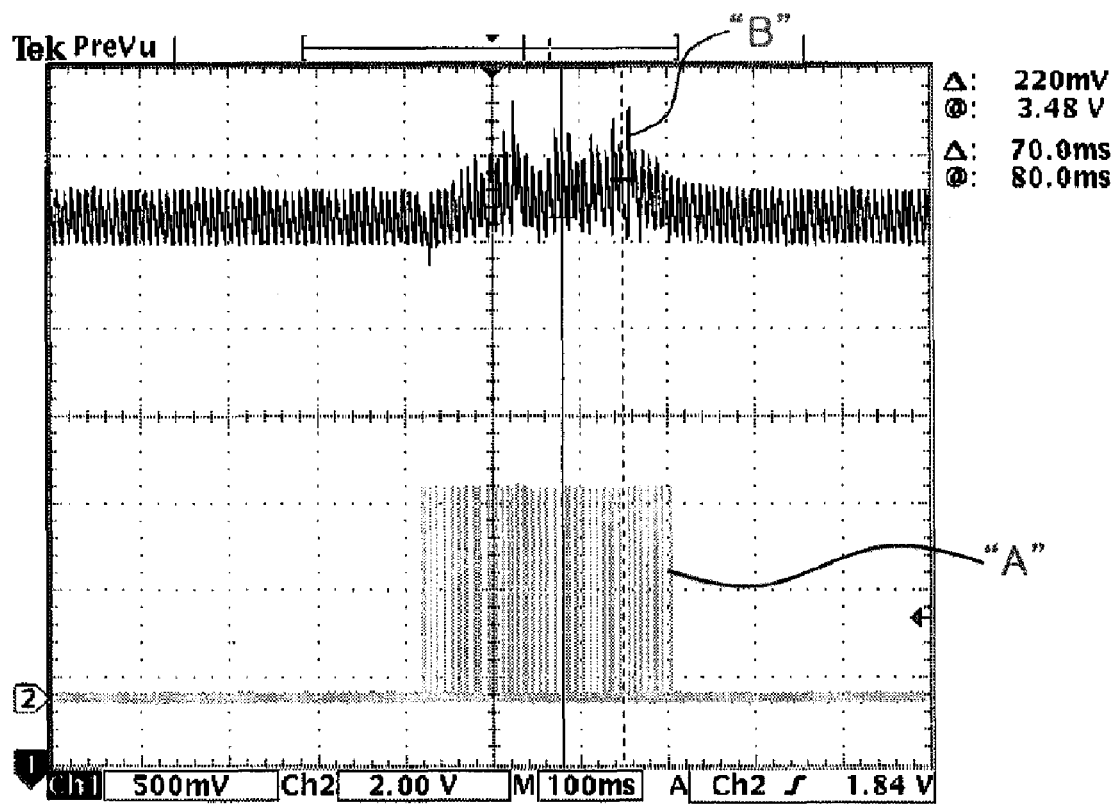
FIGS. 6A and 6B are waveform diagrams showing respective waveforms when electric current is varied at the time of generation of an arc, and when an overcurrent is detected.
Figure 6B:
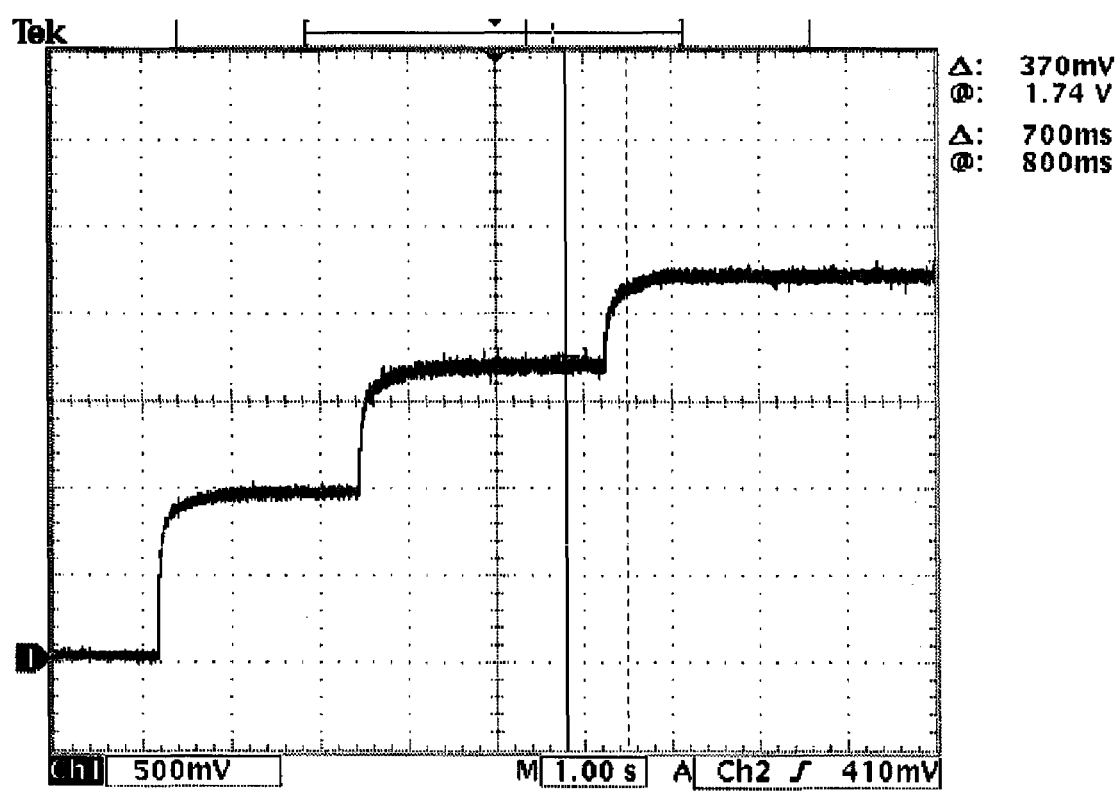

A detailed circuit of the single pulse generator 53 is illustrated in FIG. 4 and arc input/output waveforms are individually illustrated in FIG. 5.

Referring to FIG. 4, the single pulse generator 53 receives a high frequency arc input (for example, a lower waveform of FIG. 5) which has passed through the band pass filter 51 via a positive (+) input port of a comparator 531, and compares the received high frequency arc input with a reference level which is applied to a negative (−) input port of the comparator 531. The comparator 531 is configured to output a single pulse (for example, an upper waveform of FIG. 5) of a predetermined level in the case that the arc input is not less than the reference level, and to judge that the arc input is a general load characteristic in the case that the arc input is below the reference level so that the arc input is not output. In addition, a time constant circuit 533 composed of a resistor R and a capacitor C is provided between the negative (−) input port of the comparator 531 and the output end of the comparator 531, to thus adjust the pulse width of the output signal of the comparator 531 through a charging and discharging principle of the capacitor C. Thus, even if a minute signal is applied to the positive (+) input port of the comparator 531, the width of the minute signal is increased so that the minute signal can be measured in the comparator 531, to thus allow the comparator 531 to measure the arc input definitely. The arc output waveform of a single pulse form which is generated from the single pulse generator 53 is input to the microprocessor 80. In FIG. 4, R19, R21, R38, R40 and R41 denote resistors for voltage drop, and D13 denotes a diode for preventing counterflow of electric current. C10 denotes a capacitor for smooting. VCC and VCC-5V denote reference voltage sources.

In the case of arc detection, an arc signal is detected on the basis that a signal regarding a load is interrupted by the band pass filter (BPF) 51 from the arc signal, and only a signal regarding an arc is passed through the band pass filter (BPF) 51. However, even if an arc signal has been detected, unharmful arcs may ordinarily exist. For example, in the case that an electric plug is connected with an outlet, and a load switch is turned on or off, or in the case of a start lamp of a fluorescent lighting fixture, an arc of a very high frequency characteristic may exist. As a result, undesired arc signal detection may happen in case of arc detection. In order to avoid such undesired arc signal detection, an amount of electric current is a very crucial factor. For this arc detection, it should be judged whether or not an arc is interrupted proportionally with respect to an amount of electric current.

Referring to the UL1699 regulation of Underwriters Laboratories Inc., an interruption time is differently set basically according to an amount of electric current. Therefore, the present invention adopts a change of electric current in case of arc detection, in order to detect this characteristic more effectively.

In the case of a present designed mode, an amount of electric current is monitored at the time of generation of an arc, and an interruption time is set up by the monitored amount of electric current. The interruption time of electric current which is presented in an actually related standard is defined as follows.

40.4 Carbonized Path Arc Clearing Time Test 40.4.1 After being tested as described in this Section a representative AFCI shall clear the arcing fault in the time specified in Table 40.1 for the current level being tested.

TABLE 40.1

| Test current Amperes[a] | 15 Amp AFCI | 20 Amp AFCI | 30 Amp AFCI |
|---|---|---|---|
| 5 | 1 sec | 1 sec | 1 sec |
| 10 | 0.4 sec | 0.4 sec | 0.4 sec |
| Rated current | 0.28 sec | 0.20 sec | 0.14 sec |
| 150 percent rated current | 0.16 sec[b] 0.19 sec | 0.11 sec[c] 0.14 sec | 0.1 sec |

[a]Required clearing time when the switch is closed on the load side of the AFCI. See 40.4.6
[b]Required clearing time when the AFCI is closed on the fault. See 40.4.6
[c]Tests at 120 V are also applicable to cord AFCIs rated 120 V/240 V Arc Test Clearing Times if an arc occurs based on the regulation, an interruption time is set up. Therefore, a present electric current value is monitored. As a result, when an arc is generated, the arc can be interrupted. In addition, in order to confirm whether or not an arc occurs, the generated arc is judged as a real arc only when an arc signal having passed through the band pass filter (BPF) 51 and an amount of electric current are changed not less than a predetermined ratio. In this connection, the concrete description will be described later.

If it is judged as an arc fault in the result of arc detection, the microprocessor 80 sends out a trip signal to the interrupter 10, and interrupts the electric power supply. The microprocessor 80 does not only interrupt the electric power supply, but also makes the display 110 to display that the present interruption cause is due to the arc fault, with a result that a user can see that the present interruption cause has been due to the arc fault.

Meanwhile, a plurality of overcurrent detectors 60A and 60B having a respectively different response speed detect whether or not electric current flowing through the wire penetrating the current transformer (CT) 40. In particular, the first overcurrent detector 60A having a fast response speed detects a change of electric current (see a portion "B" of FIG. 6A) having generated in case of occurrence of an arc (see a portion "A" of FIG. 6A). The second overcurrent detector 60A having an enhanced precision degree and a slow response speed detects a present electric current value (see a waveform of FIG. 6B) of the wire penetrating the current transformer (CT) 40 and detects whether or not the detected present electric current value is an overcurrent. The detection signals of the overcurrent detectors 60A and 60B are input to the microprocessor 80.

The present overcurrent detection adopts a method of detecting electric current using the current transformer (CT) 40. According to the present standards, there are references that the electric power supply is interrupted within one hour or so in case of an overcurrent of 135%, and within two minutes or so in case of an overcurrent of 200%. In addition, in the case of a short circuit, the electric power supply should be interrupted within 24 ms. Under the circumstances of these present standards, the electric power supply should be instantaneously interrupted within three half waves of the frequence of 60 Hz when electric current of 5000 A flows through the wire in the shorted circuit. However, in the case of using an existing magnetic and bimetal interrupter of interrupting an overcurrent, the electric power supply should not be instantaneously interrupted by an operation time of the bimetal even if an overcurrent of 300% or 500% or more flows through the wire.

The present invention has an advantage of interrupting the electric power supply within one second when electric current is electronically detected in order to overcome these physical characteristics of the existing magnetic and bimetal interrupter.

Figure 7:
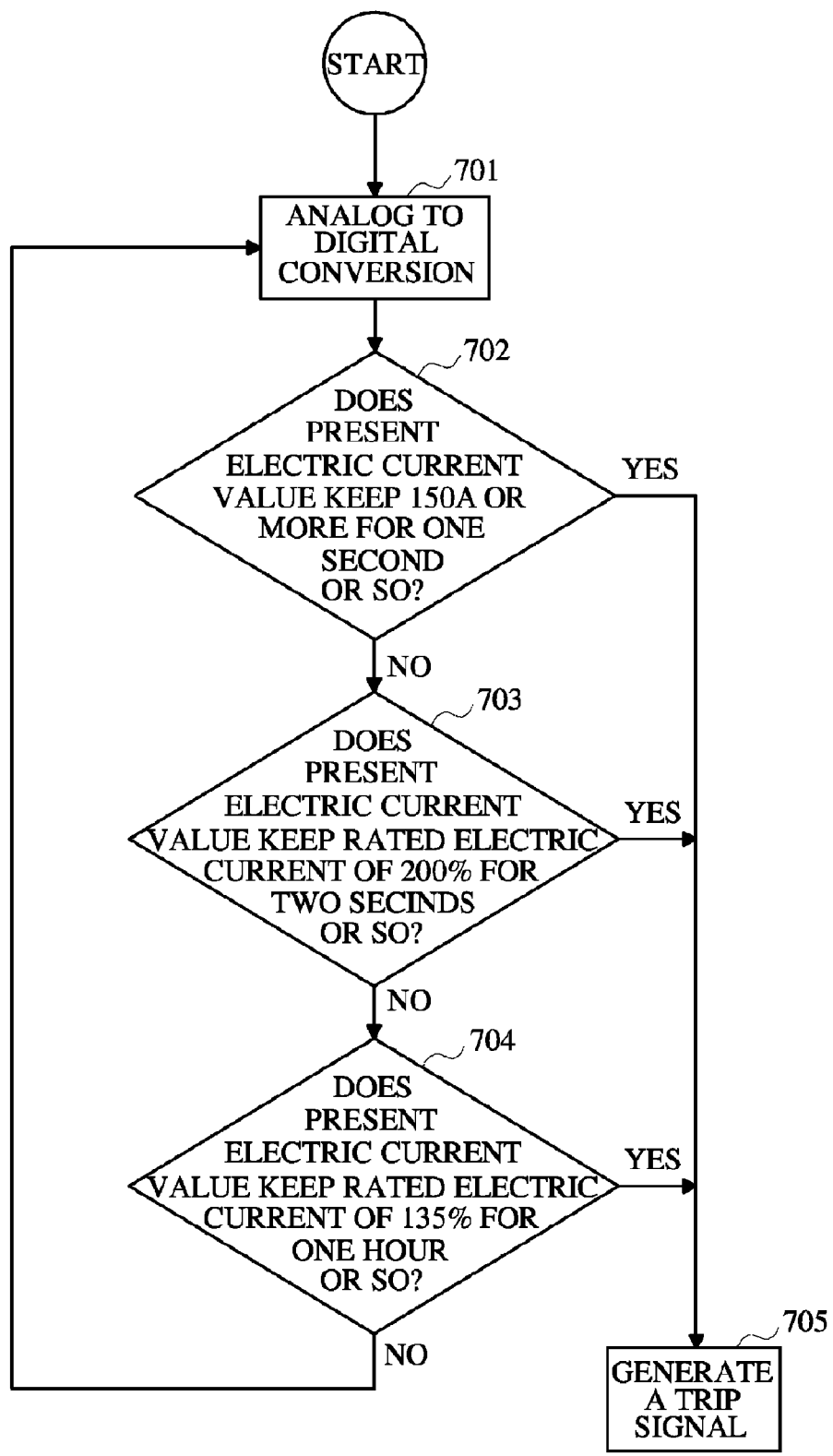
FIG. 7 is a flowchart view for explaining an overcurrent decision operation of a microprocessor of FIG. 1.

The microprocessor 80 interprets the signals which are detected in the overcurrent detectors 60A and 60B based on the above-described interruption references, according to a flowchart of FIG. 7, and judges whether or not a present load is at an overcurrent state.

Referring to FIG. 7, the microprocessor 80 converts the detection signal of an analog form input from the overcurrent detectors 60A and 60B into signals of a digital form which can be processed therein (step 701). Then, the microprocessor 80 judges whether or not a present current value is not less than 150 A and kept for one second or so, from the digitized detection signals (step 702). If the microprocessor 80 judges that the present current value is not less than 150 A and kept for one second or so, in the step 702 judgment result, the microprocessor 80 judges that the present circuit is at an overcurrent mode due to an overcurrent, and generates a trip signal for the interrupter 10 for a predetermined interruption time, to thus interrupt the electric power supply (step 705). If the microprocessor 80 does not judge that the present current value is not less than 150 A and kept for one second or so, in the step 702 judgment result, the microprocessor 80 judges whether or not the present current value is not less than a rated electric current of 200% and kept for two minutes or so (step 703). If the microprocessor 80 judges that the present current value is not less than a rated electric current of 200% and kept for two minutes or so, in the step 703 judgment result, the microprocessor 80 judges that the present circuit is at an overcurrent mode due to an overcurrent, and generates a trip signal for the interrupter 10 for a predetermined interruption time, to thus interrupt the electric power supply (step 705). If the microprocessor 80 does not judge that the present current value is not less than a rated electric current of 200% and kept for two minutes or so, in the step 703 judgment result, the microprocessor 80 judges whether or not the present current value is not less than a rated electric current of 135% and kept for one hour or so (step 704). If the microprocessor 80 judges that the present current value is not less than a rated electric current of 135% and kept for one hour or so in the step 704 judgment result, the microprocessor 80 judges that the present circuit is at an overcurrent mode due to an overload, and generates a trip signal for the interrupter 10 for a predetermined interruption time, to thus interrupt the electric power supply (step 705). If the microprocessor 80 does not judge that the present current value is not less than a rated electric current of 135% and kept for one hour or so in the step 704 judgment result, the microprocessor 80 returns to the step 701, and performs the steps 701 through 705 repetitively.

The microprocessor 80 does not only interrupt the electric power supply, but also makes the display 110 to display that the present interruption cause is due to the overcurrent, with a result that a user can see that the present interruption cause has been due to the overcurrent.

Figure 8:
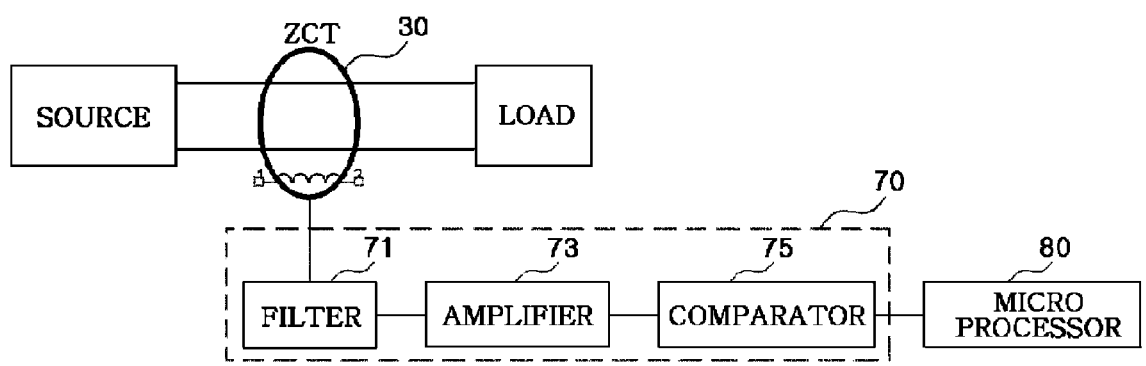
FIG. 8 is a block diagram showing an earth leakage detector of FIG. 1.

FIG. 8 shows a detailed earth leakage detector 70 of FIG. 1, in which the earth leakage detector 70 includes a filter 71, an amplifier 73 and a comparator 75.

Referring to FIG. 8, the earth leakage detector 70 removes unnecessary noise from earth leakage electric current detected in the zero phase current transformer (ZCT) 30 through the filter 71, and detects only the earth leakage signal. The earth leakage detector 70 level-amplifies the detected earth leakage signal into a predetermined magnitude through the amplifier 73, and thereafter compares the amplified result earth leakage signal with a predetermined reference signal level through the comparator 75, to accordingly output a compared result signal to the microprocessor 80. At present, under the U.S.A standards, the earth leakage is classified and detected into 4-6 mA leakage and 255 mA leakage for human body protection, respectively. Accordingly, considering the above-described U.S.A standards, the present invention employs the earth leakage detector shown in FIG. 8 to detect earth leakage.

Figure 9:
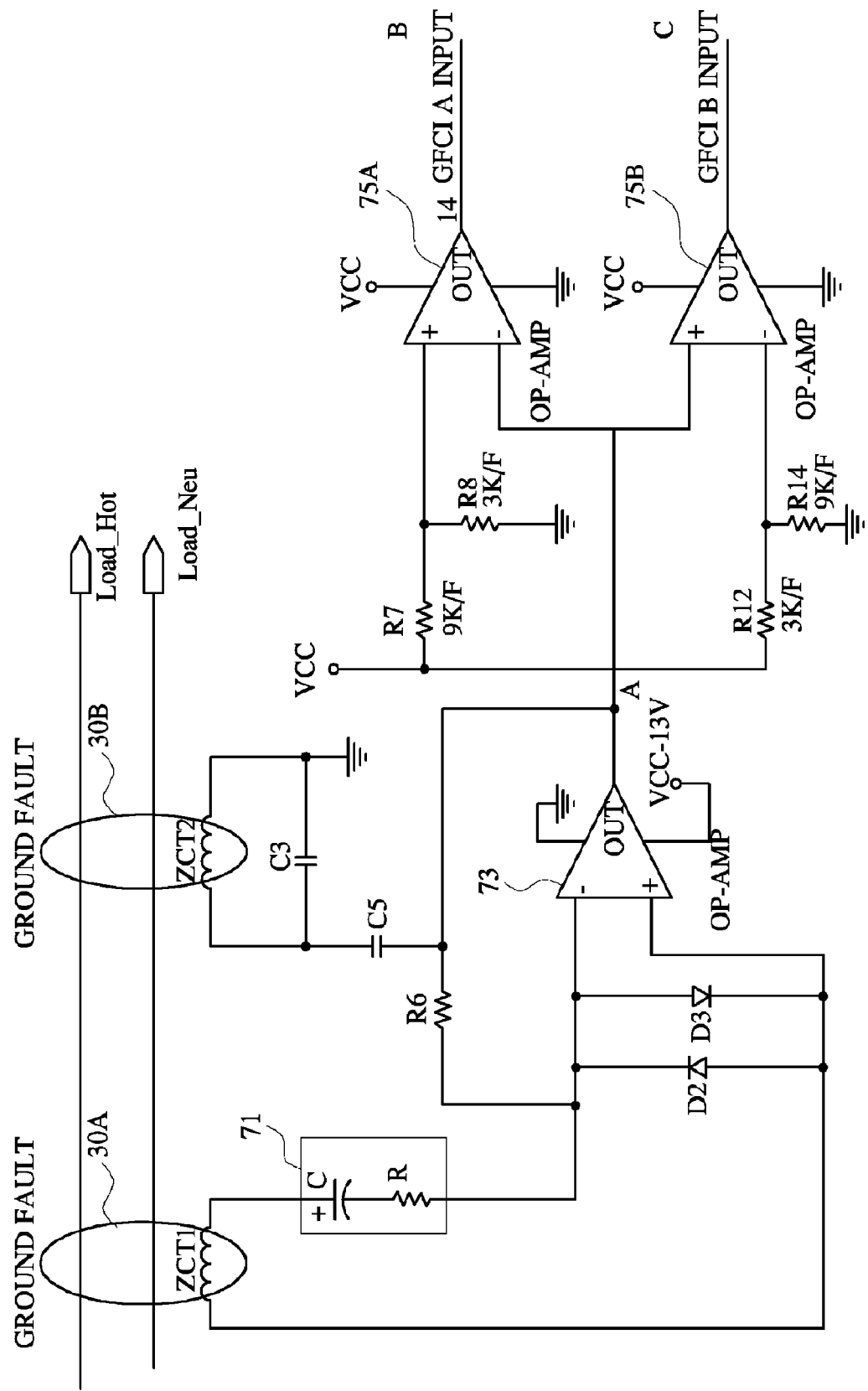
FIG. 9 is a detailed circuit diagram showing the earth leakage detector of FIG. 1.

FIG. 9 shows a detailed circuit diagram of the earth leakage detector 70 of FIG. 8.

Referring to FIG. 9, the earth leakage detector 70 employs a plurality of zero phase current transformers (ZCTs) 30A and 30B. One zero phase current transformer (ZCT) 30A of the plurality of zero phase current transformers (ZCTs) 30A and 30B detects a difference between electric current values flowing through input lines (load_Hot and Load_Neu) and inputs the detection result to the earth leakage detector 70, and the other zero phase current transformer (ZCT) 30B of the plurality of zero phase current transformers (ZCTs) 30A and 30B detects a difference between electric current values flowing through the input line (Load_Neu) and the ground line (GND) and inputs the detection result to the earth leakage detector 70. In particular, the zero phase current transformer (ZCT) 30B uses a 300:1 transform ratio, and shows a high frequency output characteristic when earth leakage has occurred. With the high frequency output characteristic, the zero phase current transformer (ZCT) 30B can measure earth leakage of the ground line (GND) and the neutral line (Load-_Neu). In FIG. 9, C3 and C5 denote capacitors, R6, R7, R8, R12, and R14 denote resistors, and D2 and D3 denotes diodes, respectively. VCC and VCC-13V denote reference voltage sources, respectively.

In the case that earth leakage electric current does not occur by the load lines (Load_Hot and Load_Neu), the input and output electric currents which flow from the input lines to the load become constant. Accordingly, the zero phase current transformers (ZCTs) 30A and 30B detect constant electric current without having an electric current difference and input the detection result to the earth leakage detector 70. Meanwhile, in the case that earth leakage electric current occurs by the load lines (Load_Hot and Load_Neu), a difference occurs between the input and output electric currents which flow from the input lines to the load. Accordingly, the zero phase current transformers (ZCTs) 30A and 30B detect constant a difference between the electric currents and input the detection result to the earth leakage detector 70. The earth leakage detector 70 performs filtering of electric current which has been input through a filter 71 composed of a RC circuit having a resistor (R) and a capacitor (C), and detects an earth leakage signal from which unnecessary noise has been removed, to then be input to the amplifier 73. The amplifier 73 level-amplifies the detected earth leakage signal into a predetermined magnitude (see a waveform of FIG. 10A), and inputs the level-amplified result to the negative (−) input port and the positive (+) input port of a plurality of comparators 75A and 75B, respectively. A first comparator 75A compares the earth leakage signal level of FIG. 10A waveform applied to the negative (−) input port with a predetermined reference signal level applied to the positive (+) input port, and outputs a pulse signal only if the earth leakage signal level is larger than the reference signal level (see a waveform "A" of FIG. 10B). A second comparator 75B compares the earth leakage signal level of FIG. 10A waveform applied to the positive (+) input port with a predetermined reference signal level applied to the negative (−) input port, and outputs a pulse signal only if the earth leakage signal level is smaller than the reference signal level (see a waveform "B" of FIG. 10B). Here, the width of the FIG. 10B waveform can be widened according to an amount of the earth leakage electric current, and establishment of an amount of the earth leakage electric current can be according to an amplification factor. The microprocessor 80 measures an area of the waveform and measures the amount of the earth leakage electric current, based on the measured area. That is, the microprocessor 80 can accurately make monitoring regarding an amount of earth leakage, and can monitor a changed width according to the amount of earth leakage. Accordingly, the microprocessor 80 cannot only detect earth leakage of 4-6 mA for human body protection, but also detect earth leakage of 30 mA or more for equipment protection. In addition, earth leakage may occur in case of occurrence of an arc, but is expressed as very feeble earth leakage.

Figure 10A:
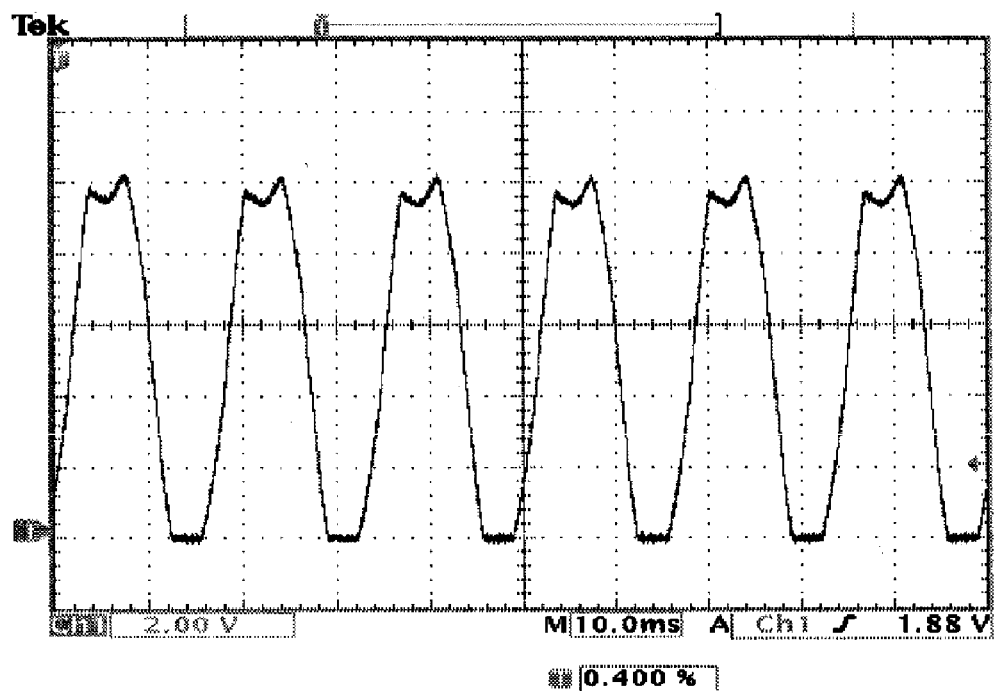
FIGS. 10A and 10B are waveform diagrams showing output waveforms in case of earth leakage.
Figure 10B:
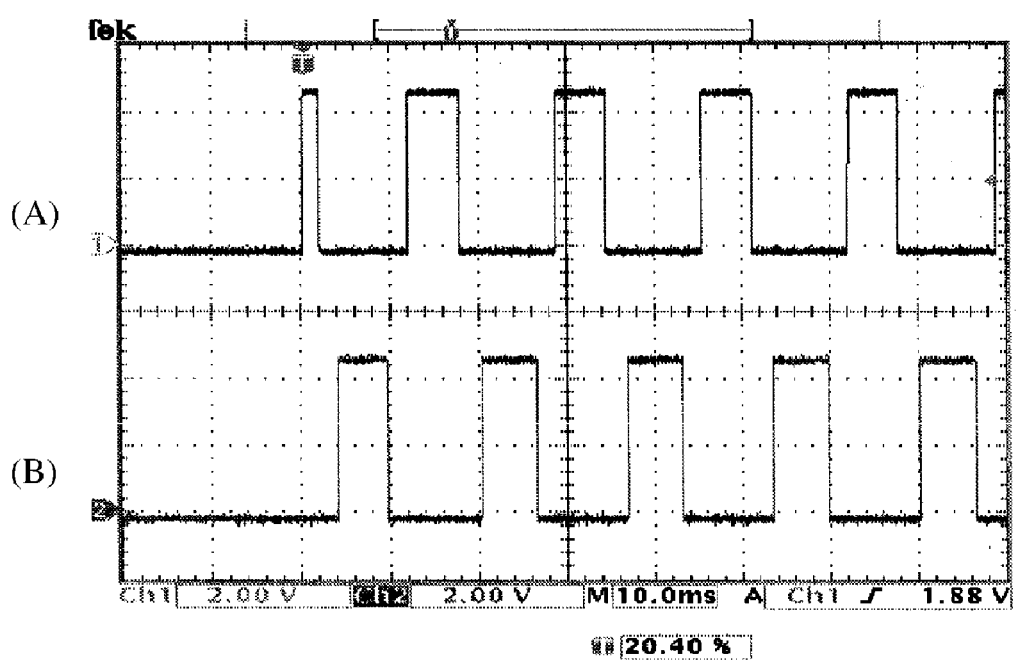
Figure 11A:
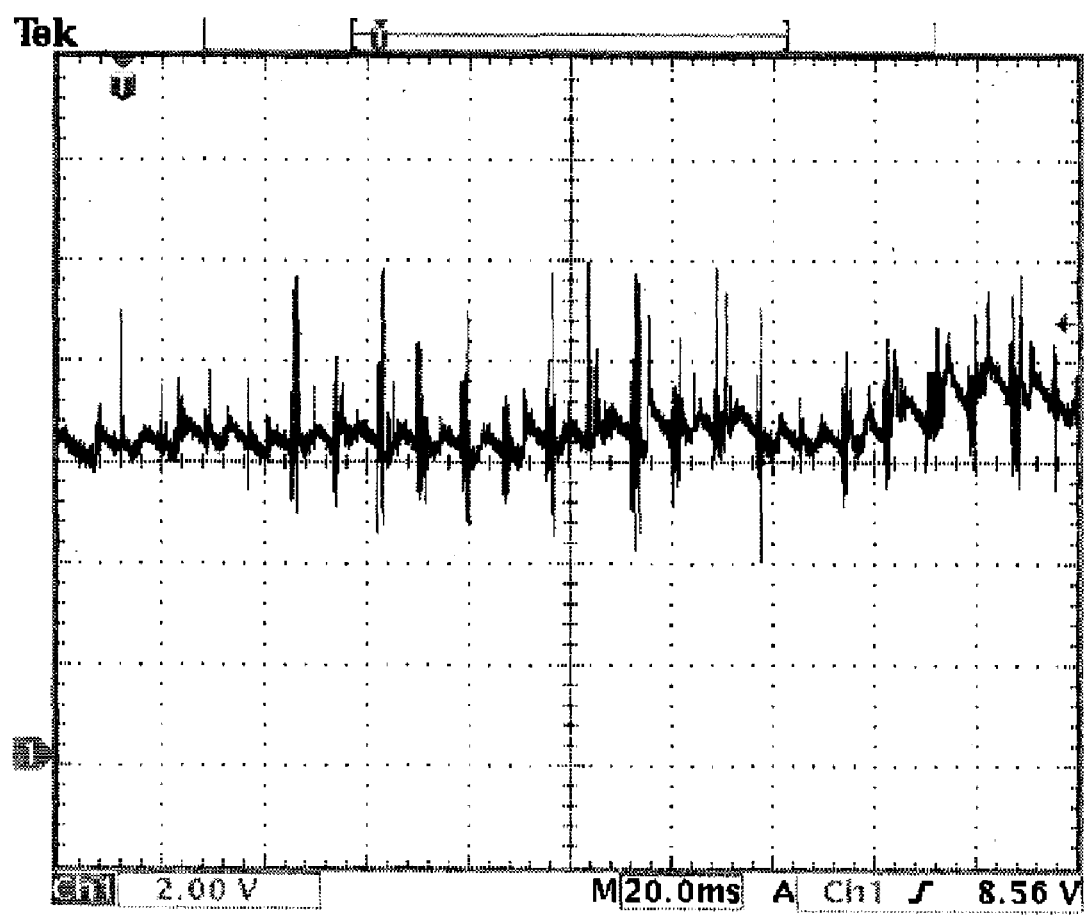
FIGS. 11A and 11B are waveform diagrams showing features of earth leakage appearing when an arc is generated.
Figure 11B:
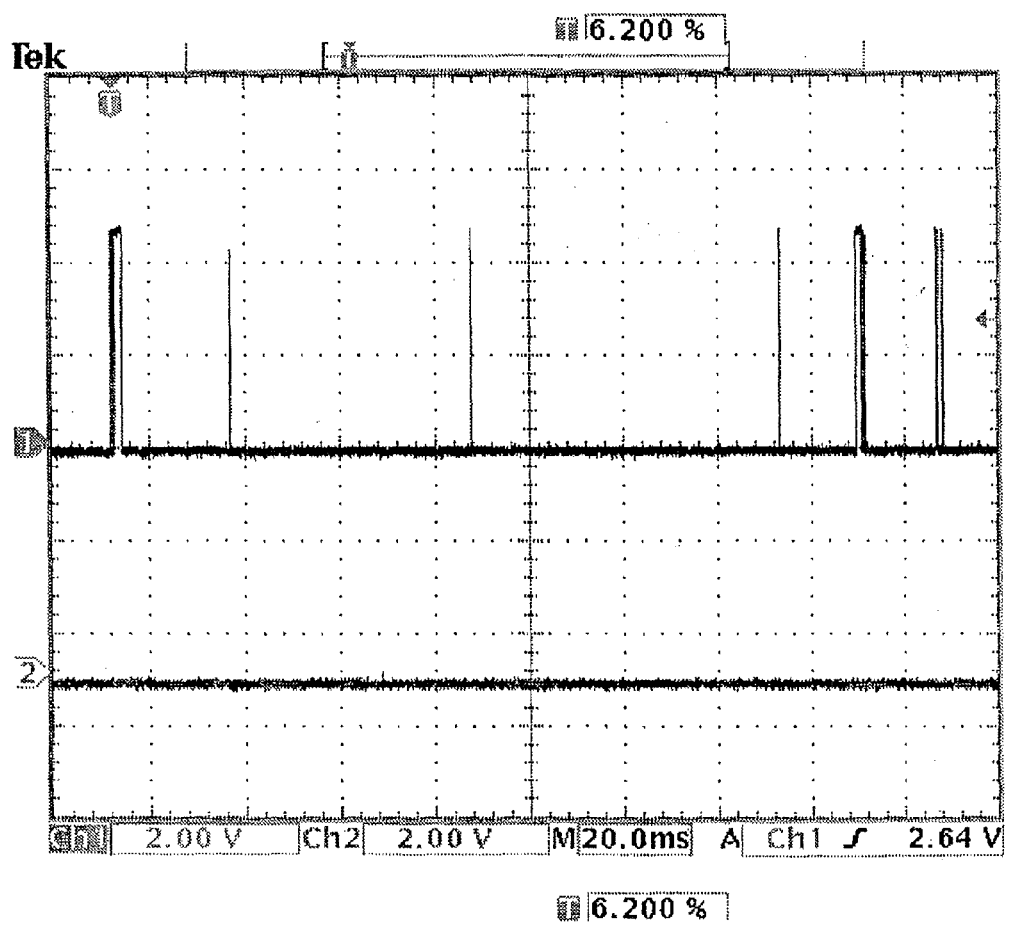

FIGS. 11A and 11B show features of earth leakage appearing in case of occurrence of an arc. The FIG. 11A waveform is an output from the amplifier 73 in the earth leakage detector 70, in the case that earth leakage may occur at the time of occurrence of an arc, and the FIG. 11B waveform shows outputs from the comparators 75A and 75B. According to the FIG. 11B waveform, it can be seen that only one of the two comparators 75A and 75B outputs a signal. When these features of the comparators 75A and 75B are used, a phenomenon of earth leakage is accurately expressed in case of occurrence of parallel arcs, and only an arc signal with respect to a corresponding load can be detected. That is, only one comparator outputs a signal in case of a load characteristic as shown in FIG. 11B, but both comparators output signals in case of an earth leakage characteristic as shown in FIG. 10B. Thus, the load characteristic and the earth leakage characteristic can be certainly discerned.

Figure 12:
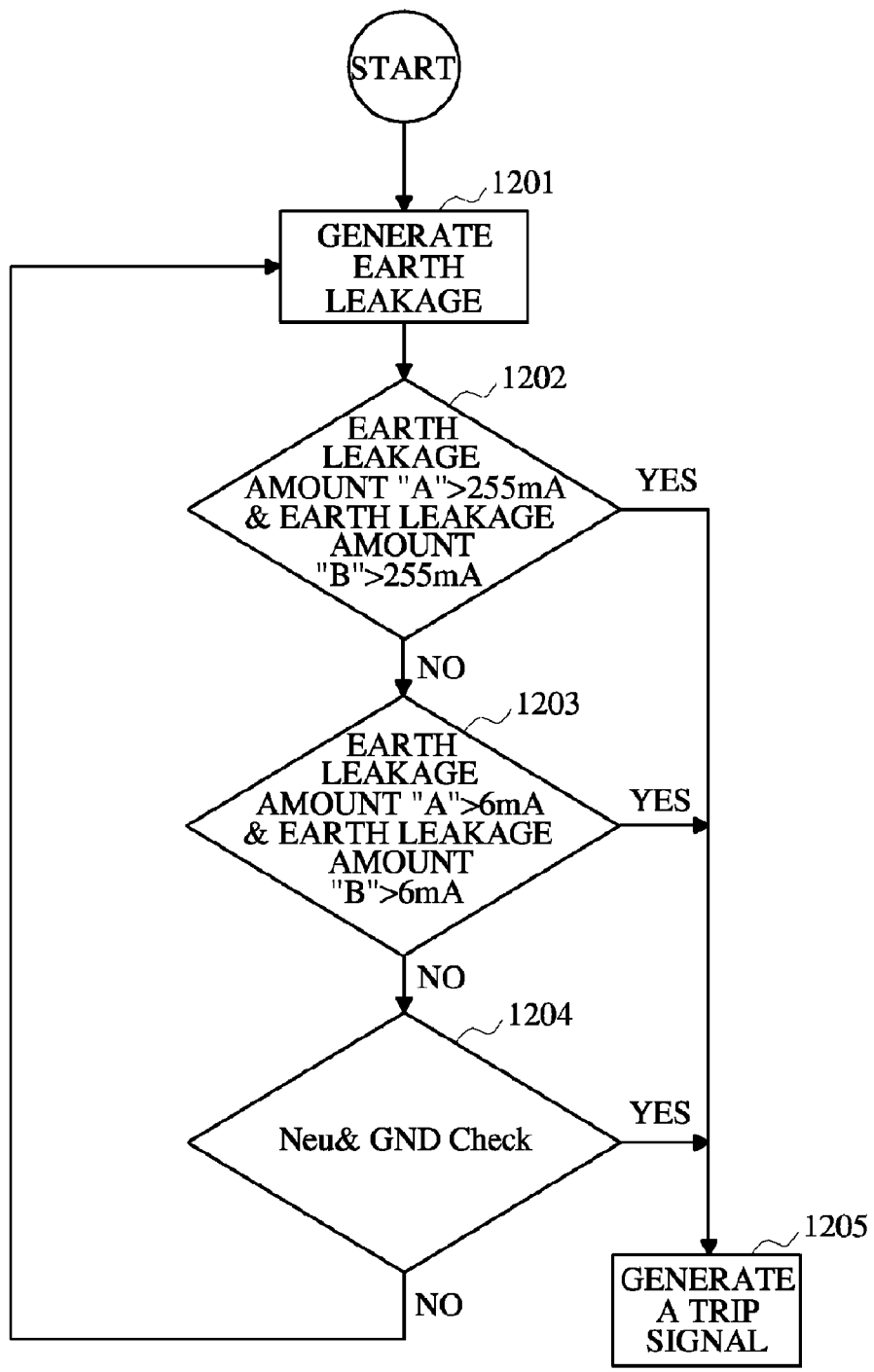
FIG. 12 is a flowchart view for explaining an earth leakage decision operation of the microprocessor of FIG. 1.

The microprocessor 80 interprets the signal which is detected in the earth leakage detector 70 according to a flowchart of FIG. 12, and judges whether or not earth leakage occurs.

Referring to FIG. 12, the microprocessor 80 receives an earth leakage signal which has been detected by the earth leakage detector 70 (step 1201). The microprocessor 80 judges whether or not both amounts of earth leakage which are output from the two comparators 75A and 75B are not less than 255 mA or so (that is, an amount of earth leakage "A">255 mA or so and an amount of earth leakage "B">255 mA or so) (step 1202). If both amounts of earth leakage are not less than 255 mA or so in the step 1202 judgment result, the microprocessor 80 judges that the earth leakage is due to the earth leakage electric current, and thus outputs a trip signal to the interrupter 10 for a predetermined interruption time, to thus interrupt the electric power supply (step 1205).

If both amounts of earth leakage are less than 255 mA or so in the step 1202 judgment result, the microprocessor 80 judges whether or not both amounts of earth leakage which are output from the two comparators 75A and 75B in the earth leakage detector 70 are not less than 6 mA or so (that is, an amount of earth leakage "A">6 mA or so and an amount of earth leakage "B">6 mA or so) (step 1203).

If both amounts of earth leakage are not less than 6 mA or so in the step 1203 judgment result, the microprocessor 80 judges that the earth leakage is due to the earth leakage electric current, and thus outputs a trip signal to the interrupter 10 for a predetermined interruption time, to thus interrupt the electric power supply (step 1205).

If both amounts of earth leakage are less than 6 mA or so in the step 1203 judgment result, the microprocessor 80 judges whether or not the earth leakage is due to the load characteristic (step 1204). That is, if a signal is generated from only one of the two comparators 75A and 75B in the earth leakage detector 70, the microprocessor 80 judges that the earth leakage is due to the load characteristic. If the microprocessor 80 judges that the earth leakage is due to the load characteristic in the step 1204 judgment result, the microprocessor 80 outputs a trip signal to the interrupter 10 for a predetermined interruption time, to thus interrupt the electric power supply (step 1205). If not, the microprocessor 80 returns to the step 1201 to then perform the steps 1201 through 1205 repetitively.

The microprocessor 80 does not only interrupt the electric power supply owing to the earth leakage electric current, but also makes the display 110 to display that the present interruption cause is due to the earth leakage electric current, with a result that a user can see that the present interruption cause has been due to the earth leakage electric current.

Figure 13:
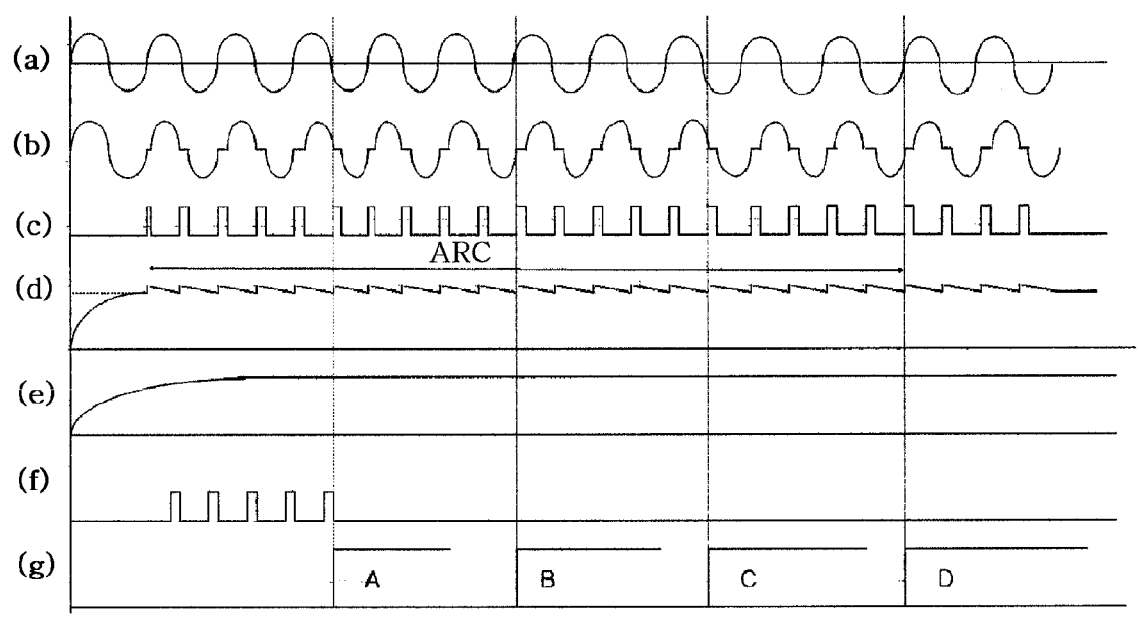
FIG. 13 is a timing diagram for explaining an arc generation decision operation of the microprocessor of FIG. 1.

FIG. 13 is a timing diagram for explaining an interruption condition of the circuit breaker in the microprocessor 80. Here, a waveform "a" and a waveform "b" represent an input voltage and a line electric current, respectively. Waveforms "c" through "f" are input to the microprocessor 80, which represent an arc detection signal, a plurality of overcurrent detection signals and an earth leakage detection signal. A waveform "g" represents an operational timing of the microprocessor 80.

First of all, if an arc signal (see the waveform "C" of FIG. 13) is generated from the arc detector 50, the microprocessor 80 performs a counting operation from a base point at which the arc signal has been generated. The microprocessor 80 also divides the base point into four points in time from "A" to "D" in the waveform "g" of FIG. 13 and judges a predetermined interruption condition at each point in time.

In the "A" region interruption condition, if it has reached a predetermined time from an initial arc generation point in time, the microprocessor 80 synthesizes all data such as arc, overcurrent, and earth leakage, and judges whether or not interruption will be performed. When an arc (see the waveform "c" of FIG. 13) of a predetermined level or higher occurs and electric current (see the waveform "d" of FIG. 13) is changed, the microprocessor 80 judges whether or not a present electric current value is at an overcurrent mode (see the waveform "e" of FIG. 13), and generates an earth leakage signal (see the waveform "f" of FIG. 13) at the overcurrent mode. In this case, the microprocessor 80 judges that the present electric current value is due to the occurrence of the arc, and generates an interrupt signal, that is, a trip signal which interrupts the interrupter 10.

In the "B" region interruption condition, the number of the arcs which have been described before is counted if the "A" region interruption condition is not met, and it is judged again whether or not a variation of the electric current exists at a predetermined point in time and present electric current is above rated electric current, to thus interrupt the electric power supply according to the judgment result.

In the "C" region interruption condition, the number of the arcs is continuously cumulatively counted if the "B" region interruption condition is not met, and it is judged again whether or not a variation of the electric current exists at a predetermined point in time and present electric current is above 5 A or so, to thus interrupt the electric power supply according to the judgment result.

In the "D" region interruption condition, the number of the arcs is continuously cumulatively counted if the "C" region interruption condition is not met, it is judged again whether or not a variation of the electric current exists at a predetermined point in time and present electric current is above 1 A or so, to thus judge that an arc occurs at the present situation in the case that all conditions are met and thus interrupt the electric power supply according to the judgment result.

Figure 14:
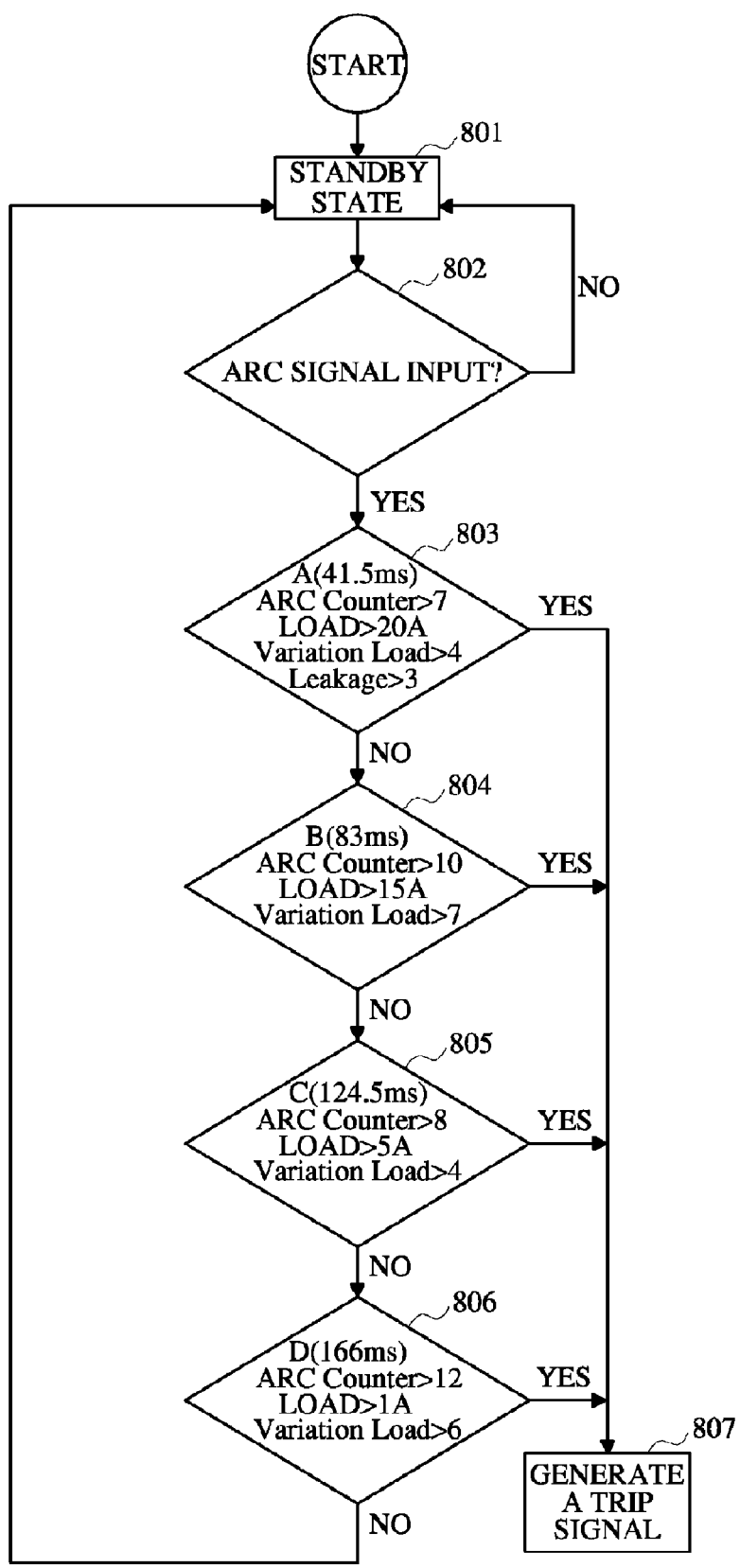
FIG. 14 is a flowchart view for explaining the arc generation decision operation of the microprocessor of FIG. 1.

The microprocessor 80 compositely interprets the respectively detected risk signals according to a flowchart of FIG. 14 based on the above-described interruption conditions and judges whether or not arc faults occur.

Referring to FIG. 14, the microprocessor 80 performs counting of arc signals (step 802) if the arc signals detected in the arc detector 50 are input at a standby state (step 801). The microprocessor 80 judges whether or not the "A" region interruption condition is met if predetermined time has passed from the initial arc signal input point in time (step 803). Here, the predetermined time has been made to 41.5 ms. In the step 803, the microprocessor 80 compositely interprets whether or not the number of arc signals is more than seven, that is, ARC counter>7, a present electric current detected in a second overcurrent detector 60B is more than 20 A, that is, LOAD>20 A, a variation of electric current detected in a first overcurrent detector 60A is more than four, that is, Variation LOAD>4, and an amount of earth leakage detected in the earth leakage detector 70 is more than three, that is, Leakage>3, and judges whether or not arc faults occur. In particular, the microprocessor 80 judges whether or not parallel arcs occur in addition to inclusion of an amount of earth leakage. If it is judged as the arc faults, the microprocessor 80 generates a trip signal for a predetermined interruption time, to thus interrupt the electric power supply (step 807). If it is not judged as the arc faults, the microprocessor 80 judges whether or not the "B" region interruption condition is met (step 804), after predetermined time has again passed from the initial point in time. In the step 804, the microprocessor 80 compositely interprets whether or not the number of the cumulated counted arc signals is more than ten, a present electric current detected in the second overcurrent detector 60B is more than 15 A, and a variation of electric current detected in the first overcurrent detector 60A is more than seven, and judges whether or not arc faults, that is, serial arcs occur. If it is judged as the arc faults, the microprocessor 80 generates a trip signal for a predetermined interruption time, to thus interrupt the electric power supply (step 807). If it is not judged as the arc faults, the microprocessor 80 judges whether or not the "C" region interruption condition is met (step 805), after predetermined time has again passed from the initial point in time. In the step 805, the microprocessor 80 compositely interprets whether or not the number of the thus-far cumulative counted arc signals from the initial arc signal input point in time is more than eight, a present electric current detected in the second overcurrent detector 60B is more than 5 A, and a variation of electric current detected in the first overcurrent detector 60A is more than four, and judges whether or not arc faults occur. Here, the reason why the number of the cumulative counted arc signals is set up less than the "B" region interruption condition is because a variation of electric current is small and arc signals are also feeble at the state where the electric current is applied although instantaneous overcurrent flows when the electric power supply is initially turned on, to thereby accurately detect arc faults considering the above-described small variation of electric current and feeble arc signals. If it is judged as the arc faults, the microprocessor 80 generates a trip signal for a predetermined interruption time, to thus interrupt the electric power supply (step 807). If it is not judged as the arc faults, the microprocessor 80 judges whether or not the "D" region interruption condition is met (step 806), after predetermined time has again passed from the initial point in time. In the step 806, the microprocessor 80 compositely interprets whether or not the number of the thus-far cumulative counted arc signals from the initial arc signal input point in time is more than twelve, a present electric current detected in the second overcurrent detector 60B is more than 1 A, and a variation of electric current detected in the first overcurrent detector 60A is more than six, and judges whether or not arc faults occur. If it is judged as the arc faults, the microprocessor 80 generates a trip signal for a predetermined interruption time, to thus interrupt the electric power supply (step 807). If it is not judged as the arc faults, the microprocessor 80 returns to the step 801 again and keeps a standby state.

It is difficult to discriminate a moment when the electric power supply is turned on from a moment when the electric power supply is varied. However, in the case that the electric current is continuously increased and the generated arc signals are feeble, a general load is turned on. If an arc signal is more than a predetermined level, and electric current is also more than a predetermined level, a risk of fire occurrence due to arc generation becomes large, and thus the electric power supply is interrupted. In addition, in the case of a certain load, it is difficult to discriminate a load characteristic with a band pass filter (BPF) as being the case. A dimmer switch for an illumination can be assumed as a representative characteristic, but only a single waveform is generated per 120 Hz in this characteristic. Therefore, in the case that only an arc signal is generated per 120 Hz, the arc signal is represented as a general load characteristic, and an arc generation interval is represented in the general load characteristic not a zero crossing range. Accordingly, such an arc signal generated per 120 Hz can be excluded. Generally, arc is generated in a zero crossing range, but it is difficult to guarantee the arc is necessarily generated in the zero crossing range. Therefore, if an arc is detected only in a limited zero crossing range, the case where such an arc may not be detected in a prime mover or the like. As a result, a variation of electric current, the number of arcs generated per a unit time, and a present electric current value are combined to detect the arcs when the arcs are detected.

In addition, according to a regulation in case of testing the parallel arcs which is proposed in the UL1699 standard, the electric power supply should be interrupted within eight half-signals when arcs are generated at the electric current more than 75 A. In this case, when the arcs occur, waveforms are made within a very short time. As a result, it may be the case that electric current of 75 A cannot be recognized as an electric current value. In the case of the eight half-waveforms, it should be judged whether or not arcs occur within 66.4 ms in a very short case. However, a sharp electric current change and the number of the generated arcs which is more than the number of the general arcs are the arc generation features in case of parallel arcs. In addition, in case of parallel arcs, earth leakage is accompanied too. Using these features, the electric power supply can be certainly interrupted in the case of generation of parallel arcs.

Meanwhile, a temperature detector 100 detects temperature in a printed circuit board (PCB) and inputs the detected temperature to the microprocessor 80. The microprocessor 80 receives the temperature detection signal from the temperature detector 100, and measures present temperature. Even in the case that a cause of fire is not due to electricity, surrounding temperature rises and thus temperature may rise in a circuit breaker, in which case it is necessary to interrupt an electric power supply. In addition, if temperature of the wire rises when overcurrent flows in the wire, the risen temperature is delivered naturally to the printed circuit board (PCB). Thus, the electric power supply can be interrupted even in this case. In addition, electric current does not increase, but a temperature rises up due to overheating of a contact portion, in the case that a connection portion is loose and thus the contact portion is overheated. Thus, the electric power supply can be interrupted even in this case.

The interrupter 10 drives a silicon controlled rectifier (SCR) 13 and enables electric current to flow through a solenoid (SOL) 11, to thus turn off the electric power supply between an external input line and a load, when the microprocessor 80 judges that risk signals such as arc faults, overcurrent, earth leakage or temperature rise occur and thus outputs an interruption signal, that is, a trip signal to the silicon controlled rectifier (SCR) 13. Accordingly, voltage flowing in the load is interrupted, to thus prevent an electric shock, occurrence of a fire or damage of the load.

The microprocessor 80 displays present time, electric current, temperature, an interruption mode, an earth leakage mode, etc., through the display 110. In this embodiment, the display 110 includes a number of light emitting diodes (LEDs) and light-emitting-displays the interruption causes according to the electric risk factors such as an arc fault circuit interrupter (AFCI), a ground fault circuit interrupter (GFCI), overcurrent and heat, after the electric power supply has been interrupted. In addition, the display 110 light-emitting-displays whether or not the microprocessor 80 operates normally to thus enable a user to confirm whether or not the microprocessor 80 operates normally.

The microprocessor 80 also includes a communication function, and discriminates whether or not an interruption cause is due to overcurrent, arcs, earth leakage, etc., and thus the microprocessor 80 transmits the discriminated result to a management system through a network in case of interruption of the electric power supply, to thereby enable a remote interruption to be made as necessary.

Meanwhile, a button type test switch SW1 and a pseudo arc generator 90 are provided to perform testing whether or not the circuit breaker according to the present invention operates normally. At the time of operation of the test switch SW1, the pseudo arc generator 90 generates a pulse signal of waveform which generates a pseudo arc signal of a certain frequency which is similar to an actual arc signal, and inputs the generated pulse signal to the arc detector 50 and the first overcurrent detector 60A, to thus perform circuit verification.

As described above, the composite type electric circuit breaker and the method thereof according to the present invention monitors the risk signals such as arc faults, overcurrent, and ground faults which are electric danger factors on a real time basis, using an embedded controller. Accordingly, the present invention has an effect of detecting various kinds of risk factors more actively and simultaneously.

In addition, the present invention has an effect of compositely reinterpreting respective detected risk signals, and grasping association of the respective risk signals, to thus detect and interrupt the respective risk signals and to thereby interrupt situations at which existing general circuit breakers cannot detect risk signals.

Thus, the present invention has an effect of simultaneously preventing electric accidents and occurrence of fire more accurately, and supporting functions of communications for network, to thereby identify and analyze interrupted reasons through an external monitoring system and maximize an efficiency of electricity management.

The present invention is not limited to the above-described embodiments. It is apparent to one who has an ordinary skill in the art that there may be many modifications and variations within the same technical spirit of the invention.

What is claimed is:

1. A composite type electric circuit breaking method, comprising the steps of:
    (a) detecting an arc signal, an overcurrent signal, and an earth leakage signal, respectively; and
    (b) counting the number of detected arc signals, and compositely interpreting the respective arc, overcurrent, and earth leakage signals detected at each point in time of a number of decision points in time, according to a predetermined interruption condition, to thereby grasp association of the respectively detected arc, overcurrent, and earth leakage signals, and to thus interrupt an electric power supply, wherein the electric power supply interruption step (b) comprises the sub-steps of:
- (b1) if a present point in time is a first decision point in time at which predetermined time has passed from an arc generated point in time, judging whether or not an arc signal is generated according to whether or not a present electric current value is at an overcurrent mode, when the number of counted arc signals is not less than a predetermined number of times and electric current is changed;
- (b2) if it is judged that no arc signals have been generated at the first decision point in time, cumulatively counting the number of arc signals generated from the first decision point in time to a second decision point in time at which predetermined time has passed from the first decision point in time, and judging whether or not the generated arc signals are considered as arc signals according to whether or not the present electric current value is not less than a rating electric current value, when the number of the cumulatively counted arc signals is not less than a predetermined number of times and electric current is changed;
- (b3) if it is judged that no arc signals have been generated at the second decision point in time, cumulatively counting the number of arc signals generated from the second decision point in time to a third decision point in time at which predetermined time has passed from the second decision point in time, and judging whether or not the generated arc signals are considered as arc signals according to whether or not the present electric current value is not less than a predetermined value, when the number of the cumulatively counted arc signals is not less than a predetermined number of times and electric current is changed; and
- (b4) if it is judged that no arc signals have been generated at the third decision point in time, cumulatively counting the number of arc signals generated from the third decision point in time to a fourth decision point in time at which predetermined time has passed from the third decision point in time, and judging whether or not the generated arc signals are considered as arc signals according to whether or not the present electric current value is not less than a predetermined value, when the number of the cumulatively counted arc signals is not less than a predetermined number of times and electric current is changed.

2. The composite type electric circuit breaking method of claim 1, wherein in the step (a) a variation of electric current which is generated in case of occurrence of arcs and a present electric current value, are separated and detected, respectively.

3. The composite type electric circuit breaking method of claim 1, wherein in the step (a) electric current due to an overcurrent is detected from a current transformer (CT), and a stability for an interruption time is secured.

4. The composite type electric circuit breaking method of claim 1, wherein in the step (b) electric current which flows from an input line to a load and electric current which flows from the input line to the ground in case of occurrence of earth leakage are separated, and wherein if an amount of earth leakage is more than a predetermined level in both the electric currents which flow to the load and the ground, respectively, it is discriminated as an earth leakage characteristic, and if an amount of earth leakage is more than a predetermined level in only one of the electric currents which flow to the load and the ground, respectively, it is discriminated as a load characteristic, to thereby measure earth leakage.

5. The composite type electric circuit breaking method of claim 1, wherein in the step (b1) parallel arcs are judged according to whether or not earth leakage occurs at an overcurrent state.

6. The composite type electric circuit breaking method of claim 1, further comprising the step of displaying an interruption cause after interruption according to electric danger factors.

7. A composite type electric circuit breaker comprising:
- a current transformer (CT) and a zero phase current transformer (ZCT) which are installed between an external voltage input line and a load end;
- an arc detector which detects electric current due to arc faults from the current transformer (CT);
- a plurality of overcurrent detectors whose response speeds are respectively differently designed and which perceives change of electric current and a present current value from the current transformer (CT), respectively, to thereby detect overcurrent;
- an earth leakage detector which detects an amount of earth leakage due to earth leakage from the zero phase current transformer (ZCT);
- a microprocessor which generates a trip signal to interrupt an electric power supply at the time of detecting overcurrent and earth leakage from the overcurrent detectors and the earth leakage detector, and combines the number of arc signals, a present current value, change of electric current and an amount of earth leakage which are detected from the arc detector, the overcurrent detectors and the earth leakage detector, respectively, to thereby judge whether or not arc faults are generated, and to thus generate the trip signal which interrupts the electric power supply when the arc faults are generated; and
- an interrupter which interrupts a supply of external voltage between the external voltage input line and the load end according to the trip signal applied from the microprocessor.

8. The composite type electric circuit breaker according to claim 7, further comprising a temperature detector to detect a printed circuit board (PCB) temperature in the circuit breaker, wherein the microprocessor applies a trip signal to the interrupter to thus interrupt the electric power supply if temperature rise is detected from the temperature detector.

9. The composite type electric circuit breaker according to claim 7, further comprising a display which displays an interruption cause after having interrupted the electric power supply and whether or not the microprocessor operates normally.

10. The composite type electric circuit breaker according to claim 7, wherein the microprocessor measures a voltage cycle of voltage which is currently input to the external voltage input line, and confirms whether or not the voltage is supplied and interrupted from the electric power supply on the basis of the measured voltage cycle, and establishes an interruption time.

11. The composite type electric circuit breaker according to claim 7, wherein the earth leakage detector detects an electric current difference between the electric currents which pass through the input line and the ground, using the plurality of zero phase current transformers (ZCTs), to thereby detect earth leakage.

12. The composite type electric circuit breaker according to claim 11, wherein the earth leakage detector comprises:

a filter which performs filtering of the electric current detected by the zero phase current transformer (ZCT) and detects an earth leakage signal from which unnecessary noise is removed;

an amplifier which level-amplifies the detected earth leakage signal into a predetermined level;

a first comparator which receives the level-amplified earth leakage signal via a negative (−) input port and compares the received level-amplified earth leakage signal with a predetermined reference signal level which is applied via a positive (+) input port, and outputs a pulse signal only when the earth leakage signal level is larger than the reference signal level; and a second comparator which receives the level-amplified earth leakage signal via a positive (+) input port and compares the received level-amplified earth leakage signal with a predetermined reference signal level which is applied via a negative (−) input port, and outputs a pulse signal only when the earth leakage signal level is smaller than the reference signal level.

13. The composite type electric circuit breaker according to claim 7, wherein the microprocessor performs counting of the arc signals detected by the arc detector, and divides a judgment point in time into a number of judgment points in time, to thereby judge whether or not arc occur according to whether or not the number of the cumulatively counted arcs, a variation of the electric current, a present electric current value and an amount of earth leakage meet predetermined interruption conditions, at each point in time.

14. The composite type electric circuit breaker according to claim 7, wherein the microprocessor a communication function, and discriminates whether or not an interruption cause is due to overcurrent, arcs, earth leakage, etc., and thus the microprocessor transmits the discriminated result to a management system through a network in case of interruption of the electric power supply, to thereby enable a remote interruption to be made as necessary.

15. The composite type electric circuit breaker according to claim 7, further comprising a test switch button for testing whether or not the circuit breaker operates normally and a pseudo arc generator which generates a test signal which is similar to an actual arc.

* * * * *